(12) United States Patent
Komatsu

(10) Patent No.: US 8,487,408 B2
(45) Date of Patent: Jul. 16, 2013

(54) SEMICONDUCTOR DEVICE HAVING BIPOLAR TRANSISTOR

(75) Inventor: Shinichi Komatsu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 28 days.

(21) Appl. No.: 13/193,178

(22) Filed: Jul. 28, 2011

(65) Prior Publication Data

US 2012/0025351 A1   Feb. 2, 2012

(30) Foreign Application Priority Data

Jul. 29, 2010   (JP) ................. 2010-171132

(51) Int. Cl.
*H01L 29/73* (2006.01)

(52) U.S. Cl.
USPC ............... 257/592; 257/552; 257/565

(58) Field of Classification Search
USPC ..................... 257/592, 552, 565
See application file for complete search history.

(56) References Cited

U.S. PATENT DOCUMENTS

| | | | | |
|---|---|---|---|---|
| 6,927,442 B2 * | 8/2005 | Kaneko et al. | ................. | 257/299 |
| 7,667,295 B2 * | 2/2010 | Fujii | ............................. | 257/592 |
| 7,777,279 B2 * | 8/2010 | Hatade et al. | ................. | 257/369 |
| 2005/0035431 A1 * | 2/2005 | Masuda | ........................ | 257/565 |
| 2006/0044719 A1 * | 3/2006 | Chen et al. | ....................... | 361/56 |
| 2008/0283967 A1 | 11/2008 | Fujii | | |

FOREIGN PATENT DOCUMENTS

JP   2009-4763 A   1/2009

* cited by examiner

*Primary Examiner* — Eugene Lee
(74) *Attorney, Agent, or Firm* — Sughrue Mion, PLLC

(57) ABSTRACT

A bipolar transistor of the invention has a second base region 116 which is formed in the surface layer of a deep well, placed between a first base region and a sinker, connected to the first base region, has an impurity concentration larger than that of the first base region, and has a depth shallower than that of the first base region; and a buried layer formed in a semiconductor layer, which has the top surface thereof brought into contact with the deep well and the sinker, and has an impurity concentration larger than that of the deep well.

4 Claims, 15 Drawing Sheets

<STRUCTURE ILLUSTRATED IN FIG. 14>

IMPURITY ION DISTRIBUTION
(Doping)

RATE OF GENERATION OF IMPACT
IONIZATION
(IIGR)

AVALANCHE BREAKDOWN OCCURRED DEEP INSIDE SUBSTRATE

AFTER SNAP-BACK
(Current Potential)

CURRENT CONCENTRATED AROUND BOUNDARY BETWEEN 214 AND 216

IMPURITY ION DISTRIBUTION
(Doping)

<STRUCTURE ILLUSTRATED IN FIG. 1>

RATE OF GENERATION OF IMPACT IONIZATION
(IIGR)

AFTER SNAP-BACK
(Current Potential)

SEMICONDUCTOR DEVICE HAVING BIPOLAR TRANSISTOR

This application is based on Japanese patent application No. 2010-171132 the content of which is incorporated hereinto by reference.

BACKGROUND

1. Technical Field

The present invention relates to a semiconductor device which contains a bipolar transistor.

2. Related Art

Semiconductor devices have a protective element for the purpose of protecting internal circuits from static electricity and so forth. The protective element is occasionally configured by using a bipolar transistor, typically as described in Japanese Laid-Open Patent Publication No. 2009-4763.

In a semiconductor device described in Japanese Laid-Open Patent Publication No. 2009-4763, the bipolar transistor has a double-layered base region. More specifically, a first base region connected to a contact is surrounded by a second base region. The second base region has an impurity concentration lower than that of the first base region.

Operations of the bipolar transistor will be outlined referring to FIG. 14. When voltage applied to a collector extracting region 222 reaches collector-base Avalanche breakdown voltage, breakdown occurs between the collector and the base 214. At this moment, current flows between the collector extracting region 222 and a base extracting region 218, through a sinker 210, a buried layer 208, and a deep well 212 (indicated by a broken line (OFF)).

If the current further increases, potential at a position right under an emitter region 220 rises by a level equivalent to (current×resistance component) ascribable to the resistance component of the first base region 214. The rise in potential causes turn-on of the junction between the emitter 220 and the base extracting region 218, and allows current to flow from the base extracting region 218 towards the emitter region 220. This triggers the bipolar transistor, and allows current to flow from the collector extracting region 222, through the sinker 210, the buried layer 208, the deep well 212 and the first base region 214, towards the emitter region 220 (indicated by a broken line (ON)).

SUMMARY

In recent years, large values are often required for both the off-breakdown voltage and breakdown current. The present inventors investigated into the semiconductor device described in Japanese Laid-Open Patent Publication No. 2009-4763, and found out that the configuration might substantially raise the off-breakdown voltage to a sufficient degree, while leaving room for improvement in the breakdown current.

According to the present invention, there is provided a semiconductor device which includes:

a semiconductor layer;

a first-conductivity-type deep well formed in the semiconductor layer;

a first second-conductivity-type impurity layer formed in a part of the surface layer of the deep well;

a first first-conductivity-type impurity layer formed in a part of the surface layer of the first second-conductivity-type impurity layer;

a second first-conductivity-type impurity layer provided at a position, brought into contact with the deep well, of the semiconductor layer;

a second second-conductivity-type impurity layer formed in the surface layer of the deep well, positioned between the first second-conductivity-type impurity layer and the second first-conductivity-type impurity layer in a plan view, connected to the first second-conductivity-type impurity layer, having an impurity concentration larger than that of the first second-conductivity-type impurity layer, and having a depth shallower than that of the first second-conductivity-type impurity layer; and a first-conductivity-type buried region formed in the semiconductor layer, having the top surface thereof brought into contact with the deep well and the second first-conductivity-type impurity layer, and having an impurity concentration larger than that of the deep well.

According to the present invention, a double-layered base region structure is formed by the first second-conductivity-type impurity layer and the second second-conductivity-type impurity layer. The first first-conductivity-type impurity layer may be allowed to function as an emitter, and the second first-conductivity-type impurity layer may be allowed to function as a collector. The second second-conductivity-type impurity layer herein has an impurity concentration larger than that of the first second-conductivity-type impurity layer, and has a shallower depth. By virtue of this configuration, after initiating operation of the bipolar transistor, current which flows from the collector to the emitter, may be made more likely to flow along not the side face of the first second-conductivity-type impurity layer, but along the bottom thereof, into the first first-conductivity-type impurity layer as the emitter. Accordingly, the level of breakdown current may be elevated.

In addition, by ensuring a distance between the second second-conductivity-type impurity layer as the base region, and the second first-conductivity-type impurity layer as the collector, a sufficient level of off-breakdown may be obtained.

According to the present invention, both of the off-breakdown voltage and the breakdown current may be elevated.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
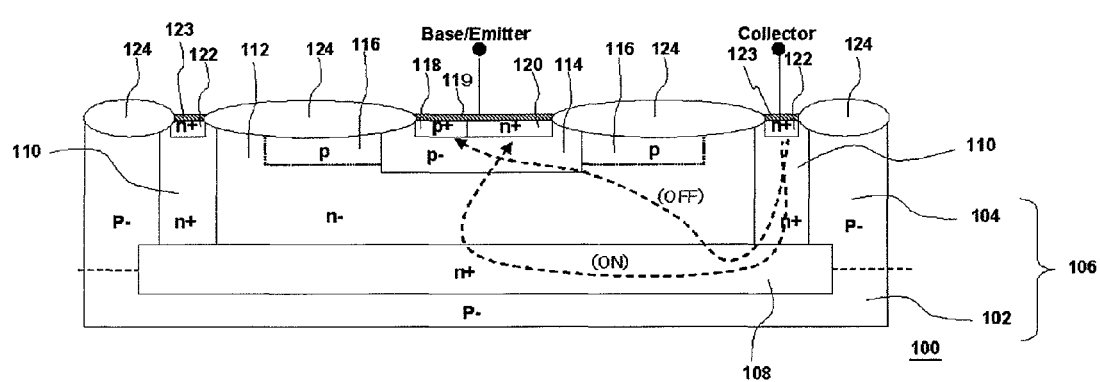
FIG. 1 is a sectional view illustrating a configuration of a semiconductor device according to one embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiment of the present invention will be explained below, referring to the attached drawings. Note that all similar constituents in all drawings will be given similar reference numerals or symbols, so as to avoid repetitive explanation.

Figure 2:
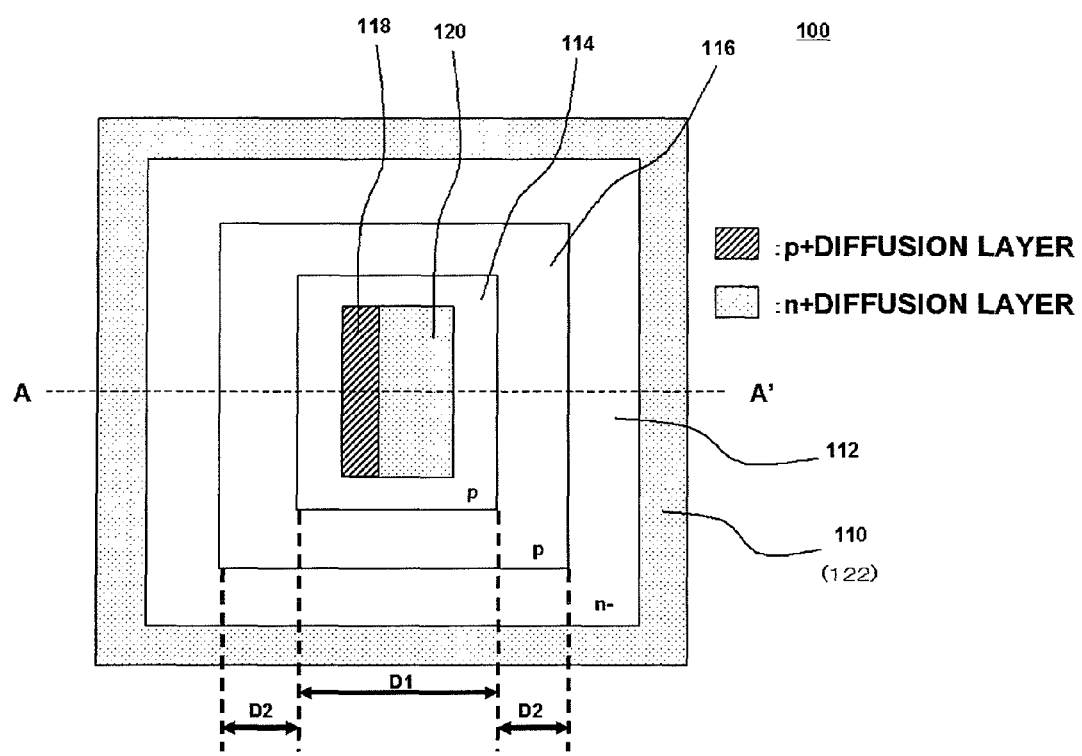
FIG. 2 is a plan view of the semiconductor device illustrated in FIG. 1.

FIG. 1 and FIG. 2 are drawings illustrating a configuration of a semiconductor device of this embodiment. FIG. 2 is a top view of a semiconductor device 100. FIG. 1 is a sectional view taken along line A-A' in FIG. 2.

The semiconductor device 100 has a semiconductor layer 106, a first-conductivity-type (n$^-$-type) deep well 112, a first first-conductivity-type impurity layer (n$^+$-type emitter region 120), a second first-conductivity-type impurity layer (an n$^+$-type sinker 110 as a collector region), a first second-conductivity-type impurity layer (p$^-$-type first base region 114), a second second-conductivity-type impurity layer (p$^+$-type second base region 116), and a first-conductivity-type (n$^+$-type) buried layer 108.

The semiconductor layer 106 is configured by a second-conductivity-type (p$^-$) semiconductor substrate 102, and a first-conductivity-type (n$^-$) epitaxial layer 104 formed over the semiconductor substrate 102. The deep well 112 is formed in a part of the surface layer of the semiconductor layer 106. The first base region 114 is formed in a part of the surface layer of the deep well 112. The emitter region 120 is formed in a part of the surface layer of the first base region 114. The sinker 110 is provided in the semiconductor layer 106, at a position brought into contact with the deep well 112. The second base region 116 is formed in the surface layer of the deep well 112, and positioned between the first base region 114 and the sinker 110 in a plan view. The second base region 116 is connected to the first base region 114, has an impurity concentration larger than that of the first base region 116, and has a depth shallower than that of the first base region 116. The buried layer 108 is formed in the semiconductor layer 106, has the top surface thereof brought into contact with the deep well 112 and the sinker 110, has an impurity concentration larger than that of the deep well, and has an impurity concentration larger than that of the deep well 112. Details will be given below.

The sinker 110 surrounds the deep well 112, while being brought into contact with the deep well 112 over the entire outer circumference thereof in a plan view. The sinker 110 has a first-conductivity-type (n$^+$) collector extracting region 122, formed in the surface layer thereof. The collector extracting region 122 has a silicide layer 123, formed in the surface layer thereof.

The first base region 114 has, in the surface layer thereof, a p$^+$-type base extracting region 118 (third second-conductivity-type impurity layer) formed therein. The base extracting region 118 has an impurity concentration larger than those two the first base region 114 and the second base region 116. The base extracting region 118 is brought into contact with the emitter region 120. The base extracting region 118 and the emitter region 120 have a silicide layer 119 continuously formed over these two regions.

In this embodiment, the buried layer 108 is formed so as to extend from the surface layer of the semiconductor substrate 102 towards the bottom of the epitaxial layer 104. The sinker 110, the deep well 112, the first base region 114, the second base region 116, the base extracting region 118, the emitter region 120, and the collector extracting region 122 are formed in the epitaxial layer 104.

The epitaxial layer 106 has a device isolation film 124 formed in the surface layer thereof. The device isolation film 124 is formed typically by LOCOS oxidation process, so as to isolate the collector extracting region 122, from the emitter region 120 and from the base extracting region 118. Note that the device isolation film 124 is not formed between the emitter region 120 and the base extracting region 118. The outer circumference of the first base region 114 and the entire portion of the second base region 116 are covered with the device isolation film 124.

The first base region 114 typically has an impurity concentration of 1E16 cm$^{-3}$ or larger and 5E16 cm$^{-3}$ or smaller, and the second base region 116 typically has an impurity concentration of 5E16 cm$^{-3}$ or larger and 1E17 cm$^{-3}$ or smaller. The second base region 116 may be good enough to be more susceptible to depletion as compared with the first base region 114, so that the impurity concentration, depth and width of the base region 116 are designed to achieve a necessary level of Avalanche breakdown voltage. More specifically, the second base region 116 is configured so as to be completely depleted by the first-conductivity-type impurity in the deep well 112, when a predetermined voltage not larger than Avalanche breakdown voltage of the bipolar transistor is applied to the collector extracting region 122. For example, width D$_2$ of the second base region 116, as viewed in the transverse direction, is approximately 3 to 8 µm.

On the other hand, the impurity concentration of the first base region 114 is designed so as to cause punch-through between the collector and the emitter. Width D$_1$ of the first base region 114 is approximately 5 to 10 µm.

Next, a method of manufacturing the semiconductor device 100 illustrated in FIG. 1 and FIG. 2 will be explained, referring to FIGS. 3A to 6.

Figure 3A:
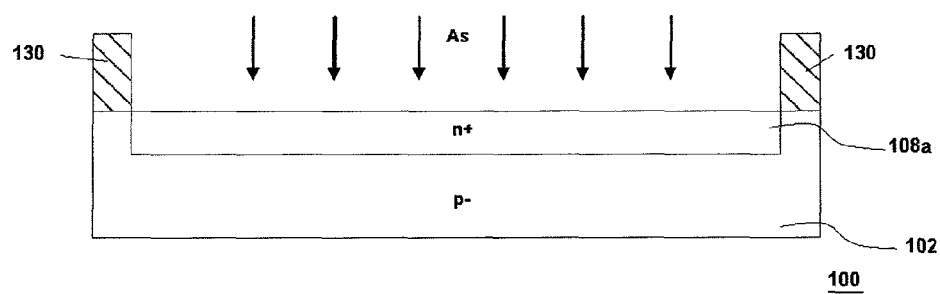
FIGS. 3A, 3B, 4A, 4B, 5A, 5B and 6 are sectional views illustrating a method of manufacturing the semiconductor device illustrated in FIG. 1.

First, as illustrated in FIG. 3A, a first protective film 130 opened in a predetermined region is formed over the P-type semiconductor substrate 102, and an n-type impurity such as As is implanted into the semiconductor substrate 102, while using the first protective film 130 as a mask. A first impurity doped region 108a is thus formed in a part of the surface layer of the semiconductor substrate 102. The first impurity doped region 108a herein is finally given as the buried layer 108, after being subjected to annealing processes described later. The first impurity doped region 108a is formed typically over the entire region (BJT region) where the deep well 112 and the sinker 110 are formed later therein. Conditions for implanting As are 50 to 100 keV, and 5×10$^{13}$ to 5×10$^{15}$ (5E13 to 5E15) cm$^{-2}$, for example. The first protective film 130 is typically a silicon oxide film. Thereafter the first protective film 130 is removed.

Figure 3B:
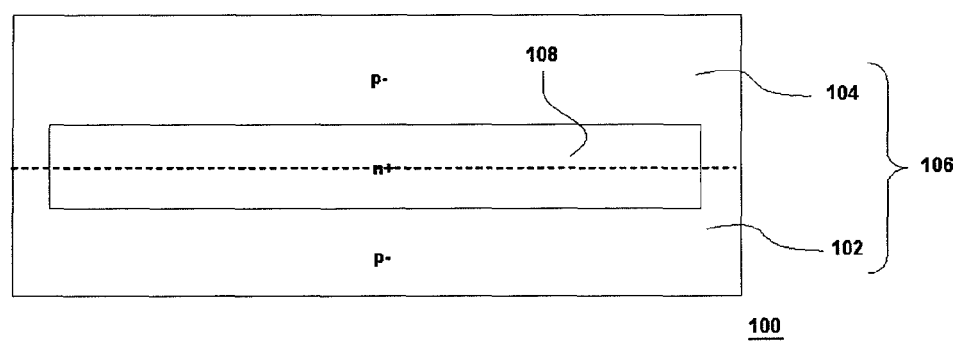

Next, as illustrated in FIG. 3B, a semiconductor layer is epitaxially grown over the semiconductor substrate 102, under heating at approximately 1,100° C. or around for 3 to 4 hours, so as to form the N-type epitaxial layer 104 (of 5 to 10 µm thick, for example). Concentration of N-type impurity in the epitaxial layer 104 may be adjusted to $1\times10^{15}$ to $1\times10^{16}$ (1E15 to 1E16) cm$^{-2}$. The semiconductor layer 106 is thus formed.

Along with the growth of the epitaxial layer 104, As in the first impurity doped region 108a diffuses into the epitaxial layer 104, while being assisted by heat applied in this process. In this way, the buried layer 108 is formed in the semiconductor layer 106.

Figure 4A:
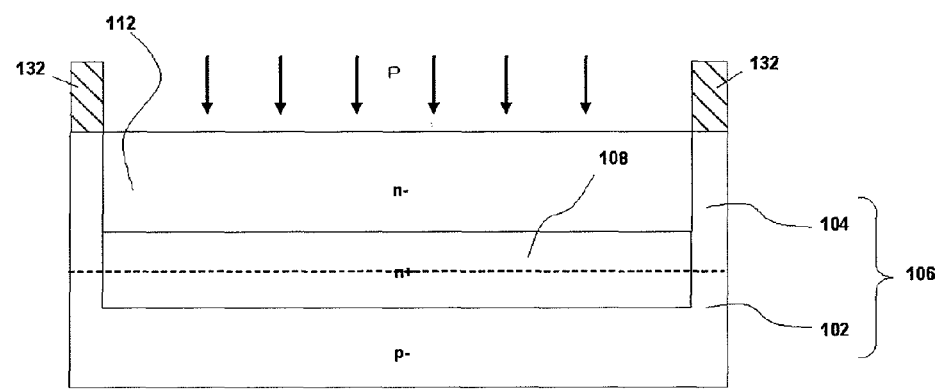

Next, as illustrated in FIG. 4A, a second protective film 132 having an opening is formed over the epitaxial layer 104. The second protective film 132 is a resist film, for example. Next, an n-type impurity, which is phosphorus (P) for example, is implanted, while using the second protective film 132 as a mask. The deep well 112 is thus formed in the epitaxial layer 104.

Figure 4B:
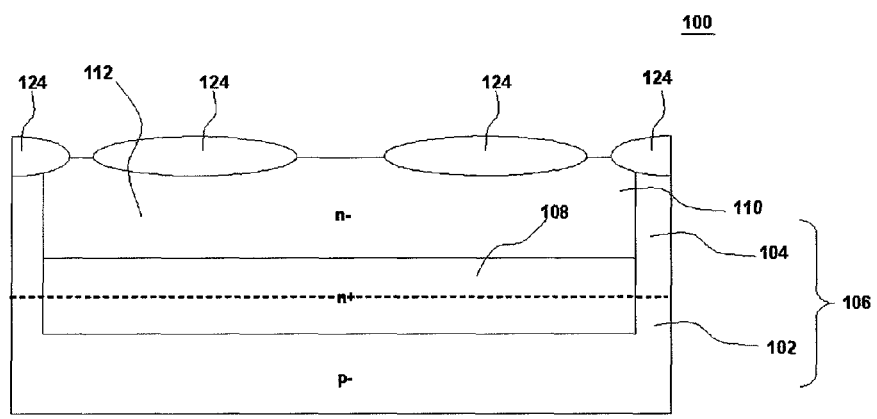

Next, as illustrated in FIG. 4B, the second protective film 132 is removed. The device isolation film 124 (LOCOS film) is then selectively formed over the surface of the semiconductor layer 106.

Figure 5A:
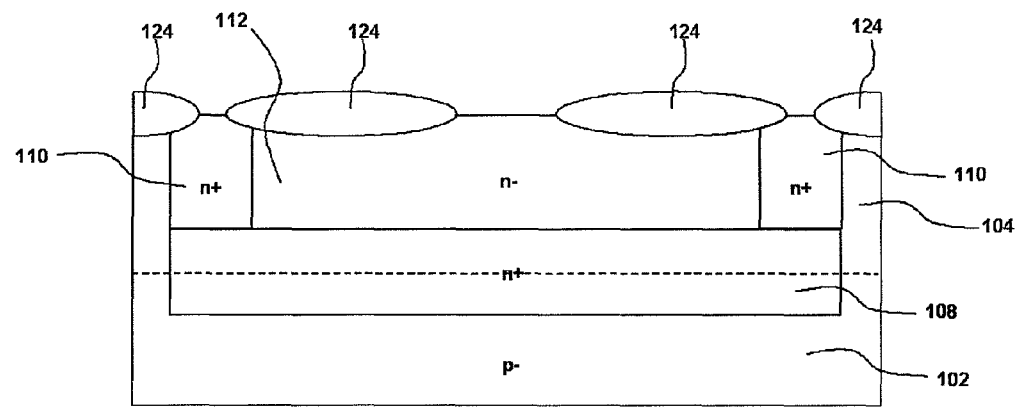

Next, as illustrated in FIG. 5A, an N-type impurity is implanted while using a mask having a predetermined pattern of opening (not illustrated), so as to form the sinker 110 (FIG. 4A). The sinker 110 may be formed typically by implanting P, where conditions of implantation of P are 50 to 100 keV, and $5\times10^{13}$ to $5\times10^{15}$ (5E13 to 5E15) cm$^{-2}$, for example. Thereafter, the work is subjected to annealing at a temperature above 1,000° C. (1,200° C., for example) for approximately 1 to 2 hours, so as to diffuse the impurity, to thereby connect the sinker 110 and the buried layer 108.

Figure 5B:
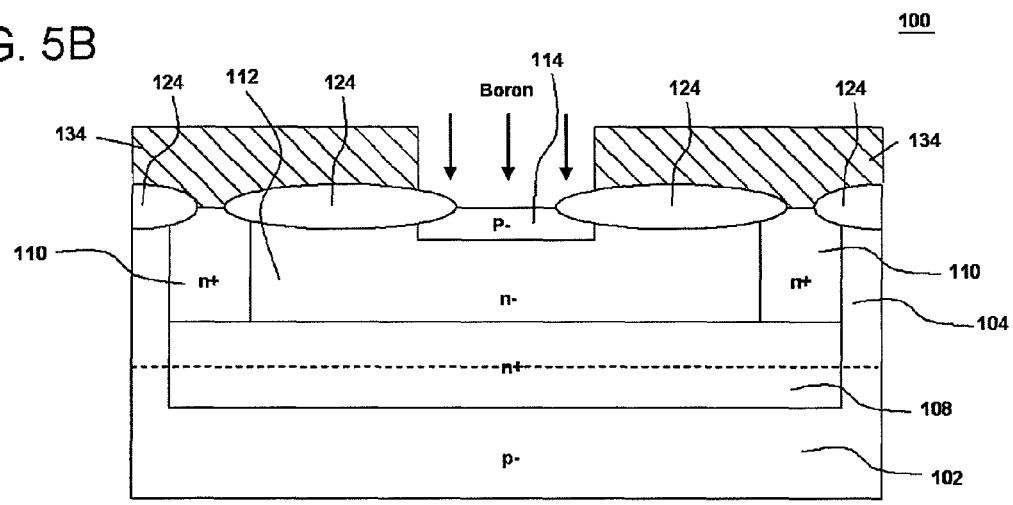

Next, as illustrated in FIG. 5B, a third protective film 134 having a predetermined pattern of opening is formed over the work. Next, a P-type impurity (boron, for example) is implanted into the surface layer of the semiconductor layer 106, while using the third protective film 134 as a mask, so as to form the first base region 114 (typically to a depth of approximately 0.3 to 0.5 µm). At this point, the depth of the first base region 114 is shallower than the final depth as shown in FIG. 1.

Figure 6:
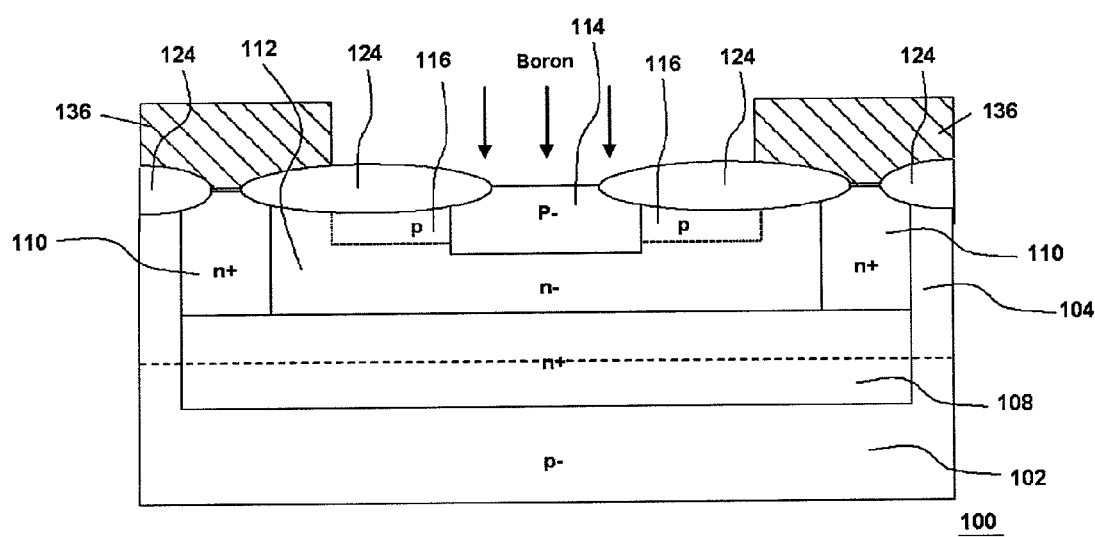

Thereafter as shown in FIG. 6, a P-type impurity, which is boron for example, is implanted into the surface layer of the epitaxial layer 104, while using the fourth protective film 136 having a predetermined pattern of opening as a mask. The second base region 116 (approximately 0.4 to 0.8 µm deep) is thus formed. A boron in this process is implanted also into the first base region 114, since the first base region 114 is not covered with the device isolation film 124, the first base region 114 is extended deeper than the second base region 116. Then, the first base region 114 is formed deeply and lower impurity concentration than the second base region 116. Note that width of the second base region 116 ($D_2$ in FIG. 2) may be adjusted to a degree at which a predetermined level of breakdown voltage may be achieved, by appropriately adjusting the widths of opening of the fourth protective film 136 and the third protective film 134.

An N-type impurity is then implanted into the surface layer of the semiconductor layer 106, while using a mask having a predetermined pattern of opening (not illustrated). The emitter region 120 and the collector extracting region 122 are thus formed respectively in the first base region 114 and the sinker 110, as illustrated in FIG. 1. An P-type impurity is then implanted into the surface layer of the semiconductor layer 106 using a mask having a predetermined pattern of opening. The base extracting region 118 is thus formed in the first base region 114, as illustrated in FIG. 1.

A metal film for forming the silicide layers is then formed typically by sputtering. Next, the semiconductor layer 106 is annealed. The silicide layers 119, 123 are thus formed as illustrated in FIG. 1. In this way, the semiconductor device 100 illustrated in FIG. 1 may be obtained.

Next, operations of the semiconductor device 100 of this embodiment will be explained. When voltage is applied through the collector extracting region 122 to the sinker 110, the second base region 116 begins to deplete from the bottom and side portions thereof, and is completely depleted at a relatively low voltage.

The impurity concentration of the deep well 112 is set higher in a portion thereof near the surface of the semiconductor layer 106, than in a portion deep inside. Accordingly, Avalanche breakdown voltage between the base and the collector is determined by a P-N junction portion between the base and the collector, in near the surface of the semiconductor layer 106. Since the second base region 116 is formed shallower than the first base region 114, so that the second base region 116 may more readily be depleted in a complete manner, when voltage is applied to the collector. For this reason, the Avalanche voltage between the base and the collector may further be elevated.

When the voltage applied to the collector reaches the Avalanche breakdown voltage between the collector and the base, breakdown occurs. At this moment, current flows from the collector extracting region 122 to the base extracting region 118, as illustrated in FIG. 1, through the sinker 110, the buried layer 108, the deep well 112, and the first base region 114 (indicated by broken line (OFF) in the drawing), rather than through the surface of the semiconductor layer 106. The current at this moment is likely to pass through the side face of the first base region 114.

If the current further increases, potential of the first base region 114, particularly at a position right under the emitter region 120 rises by a level equivalent to (current×resistance component), ascribable to the resistance component of the first base region 114. The rise in potential causes turn-on of the junction between the emitter and the base, and allows current to flow from the base extracting region 118 towards the emitter region 120. This triggers operation of the bipolar transistor, and allows current to flow from the collector extracting region 122, through the sinker 110, the buried layer 108, the deep well 112 and the first base region 114, towards the emitter region 120 (indicated by broken line (ON) in the drawing).

According to the semiconductor device 100 of this embodiment, since second base region 116 is completely depleted when voltage is applied to the collector, so that the Avalanche breakdown voltage between the base and the collector may be elevated, and thereby an off-breakdown voltage of as large as exceeding 100 V may be obtained. Also since the Avalanche breakdown voltage between the base and the collector may be determined by the transverse width of the second base region 116 (D2 in FIG. 2), so that off-breakdown voltage may be adjustable only by modifying the layout. In addition, since the Avalanche breakdown occurs deep inside the semiconductor layer 106, rather than in the surface thereof, so that even under long-duration operations the bipolar transistor may be made unsusceptible to characteristic changes.

Next, operations and effects of this embodiment will be explained. First, the present inventors examined why the breakdown current (ESD voltage) of the bipolar transistor described in the above-described Japanese Laid-Open Patent Publication No. 2009-4763, which is illustrated in FIG. 14 in our patent specification, remains in such low levels.

Figure 7:
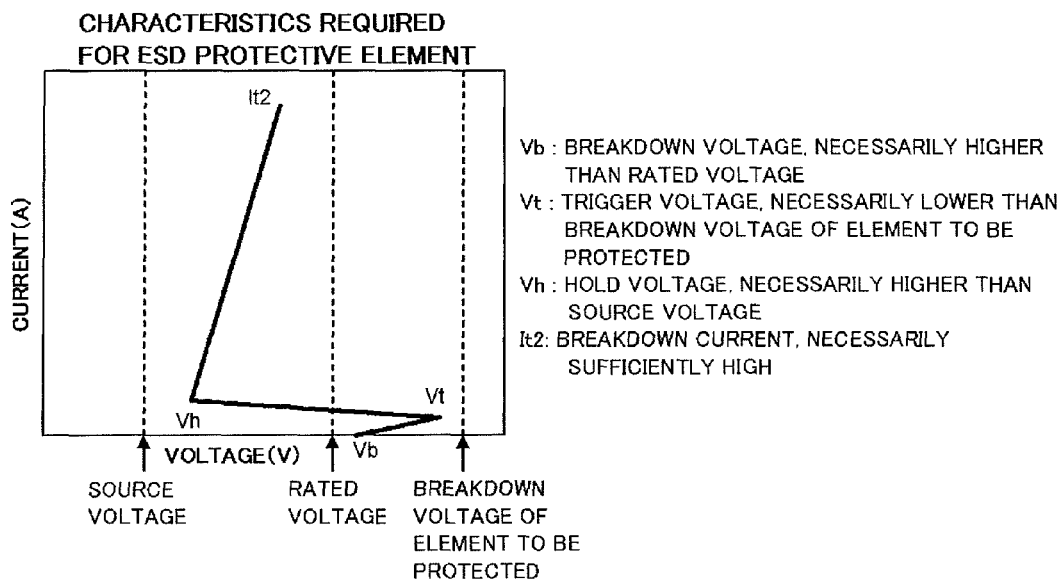
FIG. 7 is a drawing illustrating characteristics required for an ESD (electro-static discharge) protective element observable in TLP (Transmission Line Pulse) measurement.

FIG. 7 illustrates characteristics generally required for ESD protective element, obtained by TLP (Transmission Line Pulse) measurement. The TLP measurement teaches from what level of voltage or thereabove, and what level of surge current could be allowed to flow through the ESD protective element, based on measurement of snap-back characteristics of the semiconductor device, and thereby the ESD voltage may roughly be estimated from results of the measurement. In the TLP measurement, judgment may be made based on breakdown voltage (Vb), trigger voltage (Vt), hold voltage (Vh), and breakdown current (It2). In particular, a large value of breakdown current (It2) means a high level of ESD voltage.

Figure 8:
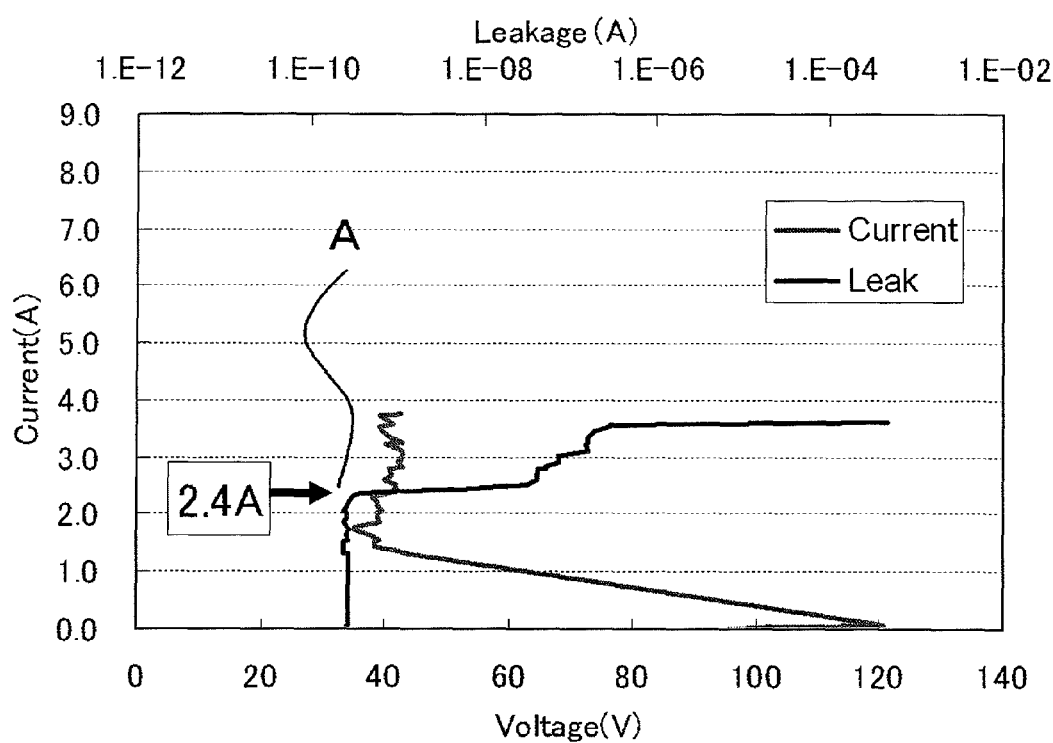
FIG. 8 is a drawing illustrating exemplary results of the TLP measurement made on the structure illustrated in FIG. 14.
Figure 14:
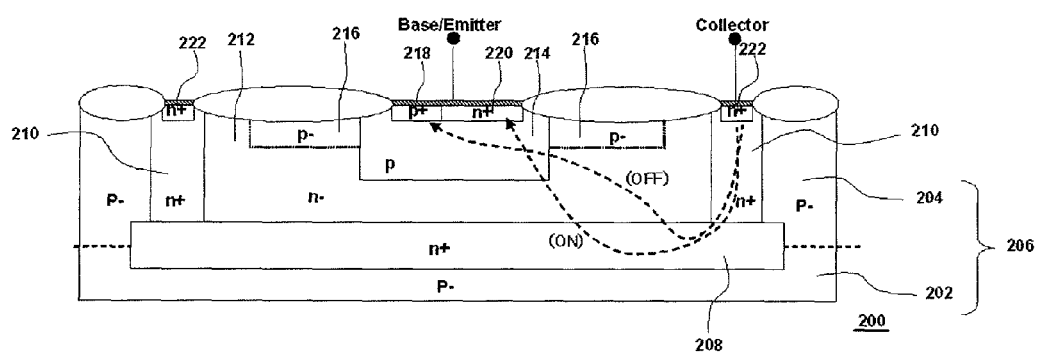
FIG. 14 is a sectional view illustrating a configuration of the semiconductor device described in Japanese Laid-Open Patent Publication No. 2009-4763.

FIG. 8 illustrates results of the TLP measurement made on the structure illustrated in FIG. 14. The structure illustrated in FIG. 14 was found to achieve a breakdown voltage of 100 V or around, whereas the breakdown current (indicated by "A" in FIG. 8) achievable herein is only as high as 2 A or around. The ESD voltage attainable herein is equivalent to 2 to 3 kV in terms of HBM (human body model) voltage, incapable of ensuring 4 kV or above.

Figure 10A:
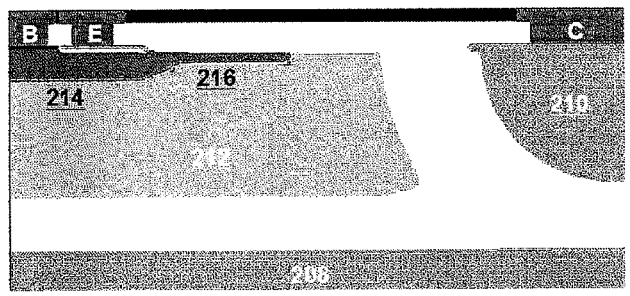
FIGS. 10A to 10F are drawings illustrating results of simulation of potential distribution.
Figure 10B:
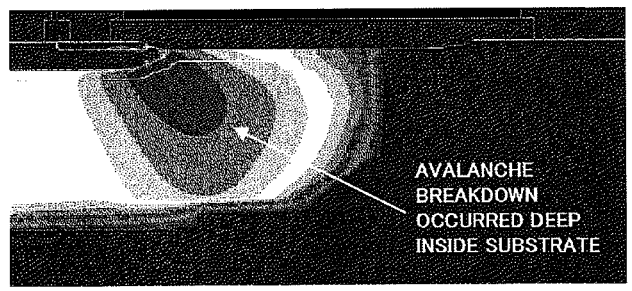
Figure 10C:
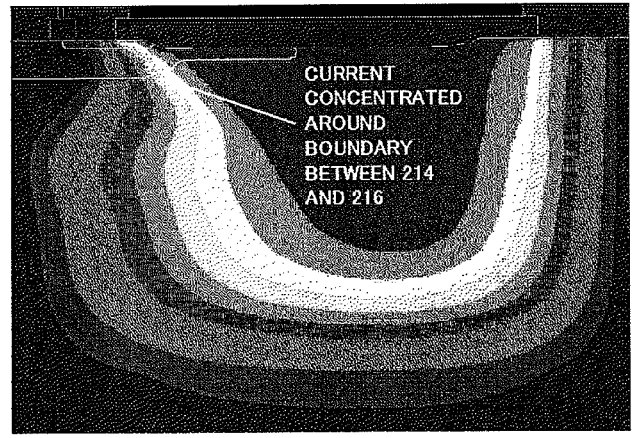

Results of simulation of potential distribution observed in the structure illustrated in FIG. 14 and FIG. 10A are shown in FIGS. 10B and 10C. In the structure illustrated in FIG. 14 after being brought into the snap-back mode, current flows as indicated by the broken line (ON) in FIG. 14, from the collector extracting region 222, through the sinker 210, the impurity buried layer 208, the deep well 212 and the first base region 214, into the emitter region 220, as may be understood from the results of TLP measurement illustrated in FIG. 8. Since the first base region 214 in this moment has an impurity concentration larger than that of the second base region 216, and consequently has a lower resistivity, so that the current flows across the boundary between the first base region 214 and the deep well 212, while being concentrated particularly in a region near the second base region 216 (FIG. 10C). It is therefore supposed that the semiconductor device will soon result in thermal breakdown due to the concentrated current after being brought into snap-back mode, and will fail in achieving a high level of breakdown voltage, and thereby fail in ensuring an HBM-ESD voltage of 4 kV or above.

Next, characteristics of the semiconductor device of this embodiment will be explained.

Figure 9:
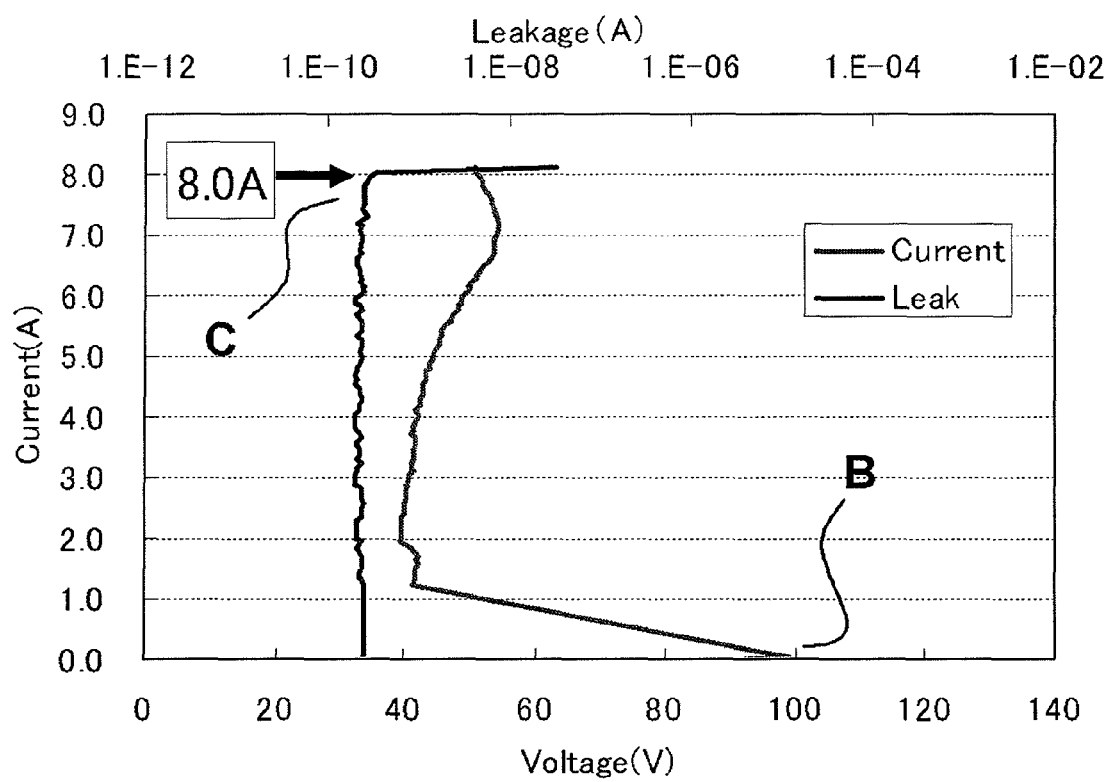
FIG. 9 is a drawing illustrating exemplary results of the TLP measurement made on the structure illustrated in FIG. 1.

FIG. 9 illustrates results of the TLP measurement made on this embodiment illustrated in FIG. 1. The structure illustrated in FIG. 1 was found to achieve a trigger voltage of 100 V or around (indicated by "B" in FIG. 9), and a breakdown current of 8.0 A or around (indicated by "C" in FIG. 9). The HBM-ESD voltage achievable herein is 4 kV or above.

Reasons why both of the trigger voltage and ESD voltage may be elevated by the semiconductor device of this embodiment will be explained below.

Figure 10D:
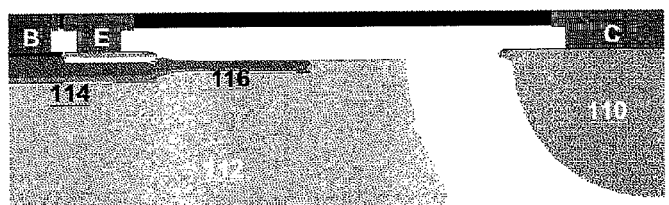
Figure 10E:
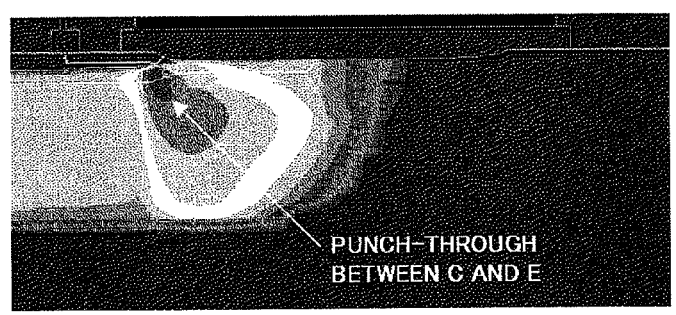
Figure 10F:
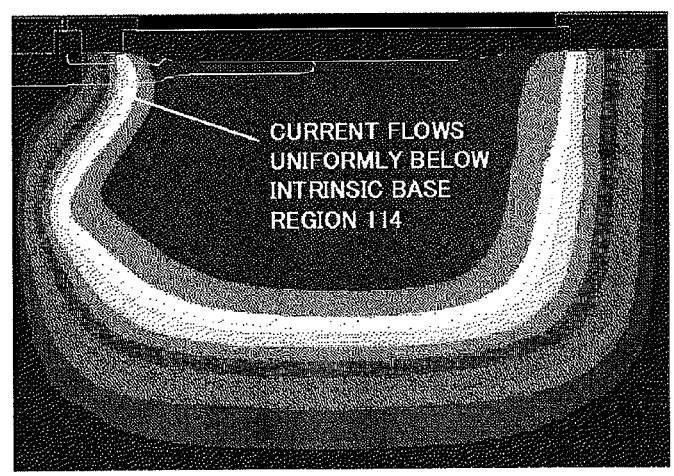

Results of simulation of potential distribution observed in the structure illustrated in FIGS. 1 and 10D are shown in FIGS. 10E and 10F. Since the first base region 114 has an impurity concentration lower than that of the second base region 116, so that punch-through occurs between the emitter and the collector, as illustrated in FIG. 10E. It is, however, supposed that the breakdown voltage remain unchanged, since the voltage is determined by the impurity concentration of the second base region 116 and the width D2 thereof illustrated in FIG. 2. In addition, since the base is completely depleted under the condition of punch-through between the emitter and the collector, so that the base consequently has an elevated resistivity. Therefore, the semiconductor device is supposed to be more readily brought into bipolar operation, reaches the trigger voltage as soon as the breakdown occurs, and more readily causes snap-back. Supposedly due to the reasons described in the above, a difference between the breakdown voltage (Vb) and the trigger voltage (Vt) is small.

Once the semiconductor device is brought into the snap-back mode, the current flows so as to be routed below the first base region 114 as illustrated in FIG. 10F, making the current less likely to concentrate (FIG. 10C), unlike the case demonstrated by the structure illustrated in FIG. 14. More specifically, the current is supposed to flow along a route indicated by the broken line (ON) in FIG. 1, from the collector extracting region 122, through the sinker 110, the impurity buried layer 108, the deep well 112 and the first base region 114, into the emitter region 120. As a consequence, as previously explained referring to FIG. 9, the semiconductor device will not result into thermal breakdown upon being brought into the snap-back mode at once, and thereby a high level of breakdown voltage may be obtained.

Figure 11:
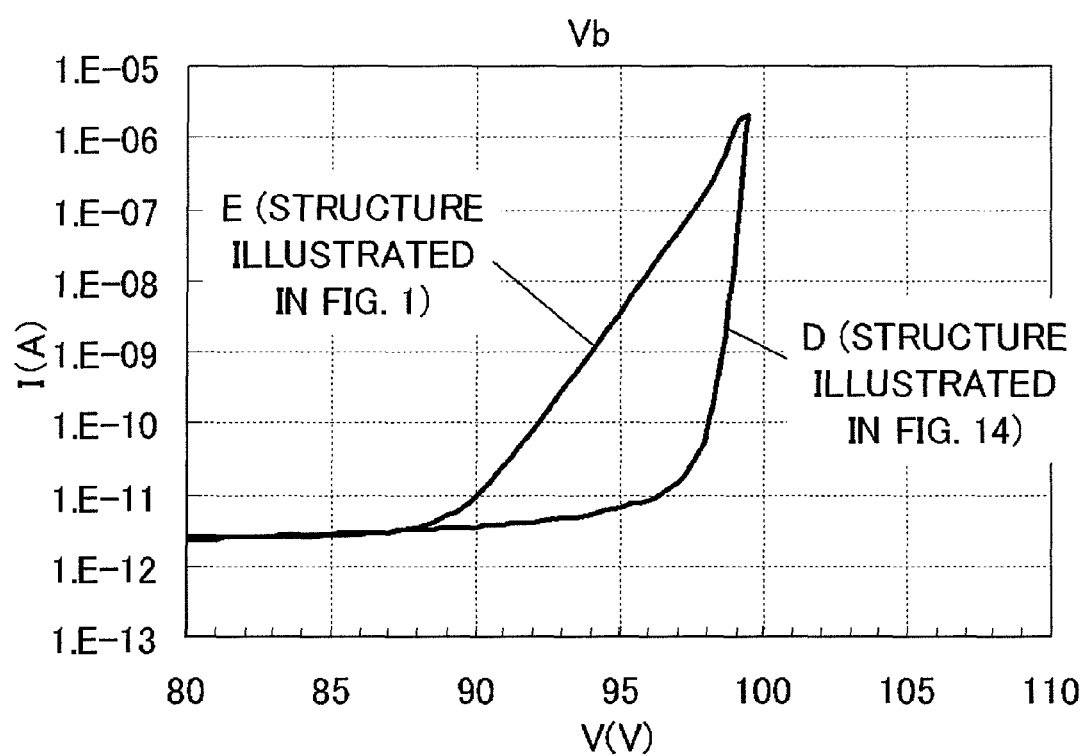
FIG. 11 is a drawing illustrating I-V characteristics respectively observed in measurement of breakdown voltage (Vb) of the structures illustrated in FIG. 14 and FIG. 1.

FIG. 11 illustrates I-V characteristics of the structures illustrated in FIG. 14 and FIG. 1, observed in the measurement of breakdown voltage (Vb). The structure illustrated in FIG. 1 (curve E) indicates occurrence of punch-through between the emitter and the collector due to a low impurity concentration of the first base region 114, demonstrating occurrence of current leakage before the breakdown voltage is reached, unlike the structure illustrated in FIG. 14 (curve D). The final level of breakdown voltage is, however, equivalent to that of the structure illustrated in FIG. 14.

Figure 12:
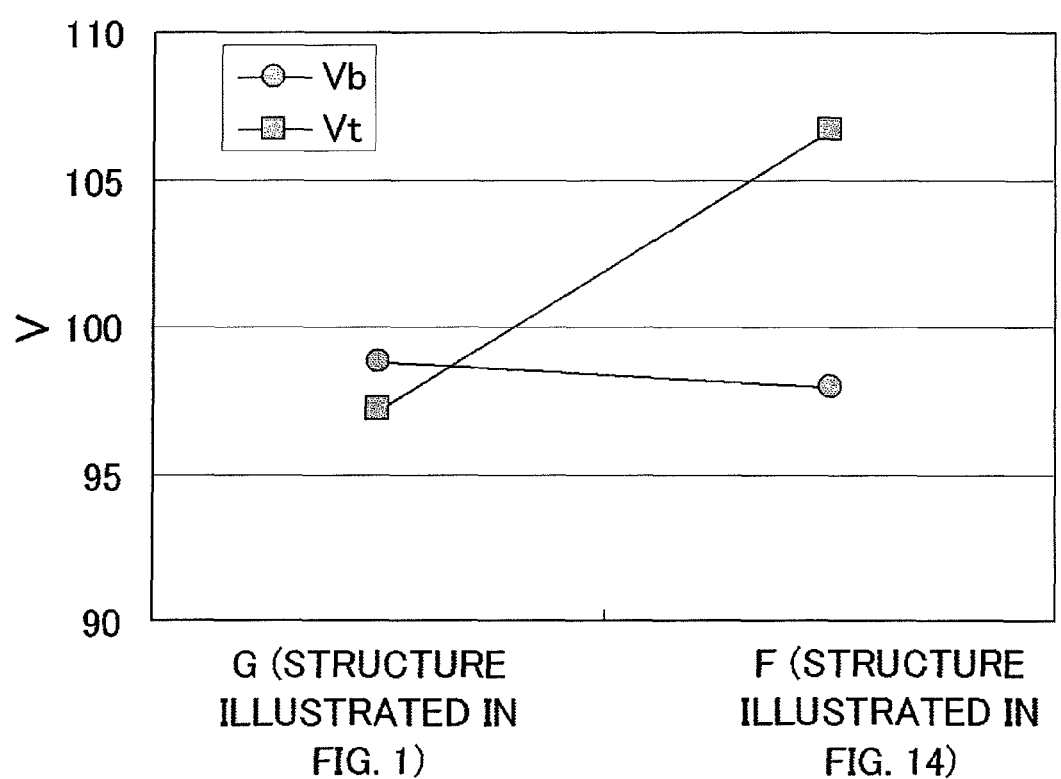
FIG. 12 is a drawing illustrating relations between breakdown voltage (Vb) and trigger voltage (Vt) of the structures illustrated in FIG. 14 and FIG. 1.

FIG. 12 illustrates relations of the breakdown voltage (Vb) and the trigger voltage (Vt), compared between the structures illustrated in FIG. 14 and FIG. 1. The structure illustrated in FIG. 14 (points F) represents a difference between both voltages of 10 V or around, whereas the structure illustrated in FIG. 1 (points G) represents that both voltages are equally level. Generally in circuit design, a smaller difference between the breakdown voltage (Vb) and the trigger voltage (Vb), both of which fallen on the lower side of the breakdown voltage of an element to be protected, makes the voltage settings of the ESD protective element easier, as may be understood from FIG. 7. Accordingly, the circuit design for the structure illustrated in FIG. 1 is easier, as compared with the structure illustrated in FIG. 14.

Embodiment in the above dealt with the case where the N-type epitaxial layer 104 was formed over the semiconductor substrate 102. However, in another possible example, a P-type epitaxial layer may be formed over the semiconductor substrate 102, and then an N-type impurity ion may be implanted so as to form the deep well 112.

Figure 13:
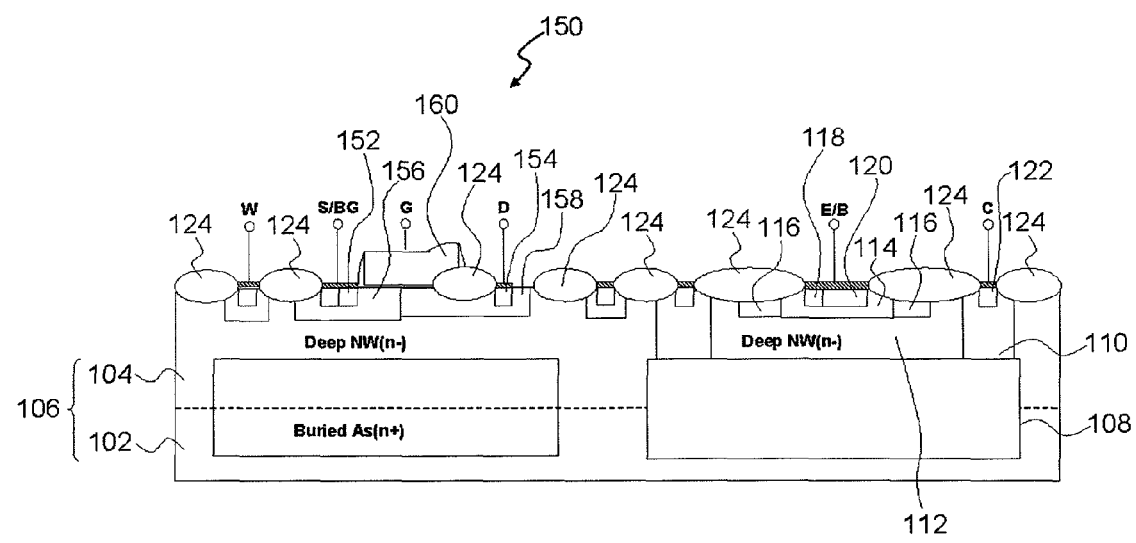
FIG. 13 is a sectional view illustrating a configuration of a semiconductor device of a modified example.

Still alternatively as illustrated in FIG. 13, a MOS transistor 150 may be formed in the semiconductor layer 106, together with the bipolar transistor illustrated in FIG. 1. The MOS transistor 150 has a source region 152, a drain region 154, a first channel region 156, a second channel region 158, and a gate electrode 160. The source region 152 and the drain region 154 are formed in the surface layer of the semiconductor layer 106. The first channel region 156 is formed around the source region 152. The second channel region 158 is formed around the drain region 154, and has an impurity concentration lower than that of the first channel region 156. The gate electrode 160 is formed over the semiconductor layer 106, particularly in a region between the source region 152 and the drain region 154. The MOS transistor 150 has a so-called RESURF structure, making use of depletion of PN junction, aiming at achieving high breakdown voltage and low ON-resistance.

Below the MOS transistor 150, a buried layer similar to the buried layer 108 is formed. A deep well region (Deep NW(n⁻)) below the second channel region 158 is formed similarly to the deep well 112. By adopting such configuration, the second base region 116 may completely be depleted under conditions same with those required for completely depleting the second channel region 158 of the MOS transistor 150. Accordingly, the second channel region 158 and the second base region 116 may be formed at the same time. In other words, the second base region 116 may be formed without adding any dedicated process, even if the bipolar transistor is hybridized with the MOS transistor having the RESURF structure.

It is apparent that the present invention is not limited to the above embodiments, that may be modified and changed without departing from the scope and spirit of the invention.

What is claimed is:

1. A semiconductor device comprising:
   a semiconductor layer;
   a first-conductivity-type deep well formed in the semiconductor layer;
   a first second-conductivity-type impurity layer formed in a part of the surface layer of the deep well;
   a first first-conductivity-type impurity layer formed in a part of the surface layer of the first second-conductivity-type impurity layer;
   a second first-conductivity-type impurity layer provided at a position, brought into contact with the deep well, of the semiconductor layer;
   a second second-conductivity-type impurity layer formed in the surface layer of the deep well, positioned between the first second-conductivity-type impurity layer and the second first-conductivity-type impurity layer in a plan view, connected to the first second-conductivity-type impurity layer, having an impurity concentration larger than that of the first second-conductivity-type impurity layer, and having a depth shallower than that of the first second-conductivity-type impurity layer;
   a first-conductivity-type buried region formed in the semiconductor layer, having the top surface thereof brought into contact with the deep well and the second first-conductivity-type impurity layer, and having an impurity concentration larger than that of the deep well; and
   a third second-conductivity-type impurity layer formed in the surface layer of the first second-conductivity-type impurity layer, brought into contact with the first first-conductivity-type impurity layer, and having an impurity concentration larger than that of the second second-conductivity-type impurity layer.

2. The semiconductor device according to claim 1, further comprising:
   a silicide layer formed so as to extend from the first first-conductivity-type impurity layer and the third second-conductivity-type impurity layer.

3. The semiconductor device according to claim 1, further comprising:
   a device isolation film isolating the second first-conductivity-type impurity layer, from the first first-conductivity-type impurity layer and from the third second-conductivity-type impurity layer.

4. The semiconductor device according to claim 1,
   wherein the second second-conductivity-type impurity layer is completely depleted, when a predetermined voltage not higher than Avalanche breakdown voltage is applied to the second first-conductivity-type impurity layer.

* * * * *